(12) United States Patent
Lin

(10) Patent No.: US 11,776,636 B2
(45) Date of Patent: Oct. 3, 2023

(54) MEMORY ARRAY AND OPERATION METHOD THEREOF

(71) Applicant: Winbond Electronics Corp., Taichung (TW)

(72) Inventor: Lih-Wei Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 155 days.

(21) Appl. No.: 17/571,525

(22) Filed: Jan. 9, 2022

(65) Prior Publication Data

US 2023/0223089 A1     Jul. 13, 2023

(51) Int. Cl.
| | |
|---|---|
| *G11C 16/00* | (2006.01) |
| *G11C 16/26* | (2006.01) |
| *G11C 16/24* | (2006.01) |
| *G11C 16/08* | (2006.01) |
| *G11C 16/04* | (2006.01) |

(52) U.S. Cl.
CPC .......... *G11C 16/26* (2013.01); *G11C 16/0483* (2013.01); *G11C 16/08* (2013.01); *G11C 16/24* (2013.01)

(58) Field of Classification Search
CPC .............. G11C 11/161; G11C 11/1659; G11C 11/1673; G11C 11/1675; G11C 11/1655; G11C 11/1657; G11C 11/18; G11C 13/004; G11C 13/0069; G11C 8/16; G11C 11/1653; G11C 11/1693; G11C 11/2255; G11C 11/54; G11C 11/5607; G11C 2013/0045; G11C 2013/0078; G11C 13/0009; G11C 11/412; G11C 11/419; G11C 13/0004; G11C 16/0483; G11C 16/08; G11C 16/24; G11C 16/26; G11C 2207/002; G11C 2207/2281; G11C 2207/229; G11C 7/02; G11C 7/18; G11C 7/22; H10B 61/22; H10B 61/20; H10B 61/00; H10B 63/30

See application file for complete search history.

(56) References Cited

U.S. PATENT DOCUMENTS

| | | |
|---|---|---|
| 2019/0369966 A1 | 12/2019 | Hsu |
| 2020/0226073 A1 | 7/2020 | Lai et al. |
| 2021/0210127 A1* | 7/2021 | Drouard ................ G11C 11/161 |

* cited by examiner

Primary Examiner — Thong Q Le
(74) Attorney, Agent, or Firm — JCIPRNET

(57) ABSTRACT

A memory array and its operation method are provided. The array includes plural sets of word lines; plural bit lines; and plural memory cell each arranged at intersection of the plural sets of word lines and the plural bit lines. Each memory cell has first and second conductive filament component and a switch circuit, and one ends of the first and the second conductive filament components are coupled to corresponding bit lines and the other ends thereof are coupled to the switch circuit. In the differential mode, read is performed based on the reading currents of the first and the second conductive filament components. In the single-ended mode, read is performed based on a reference current and a reading current of the first or the second conductive filament component that is formed successfully.

19 Claims, 12 Drawing Sheets

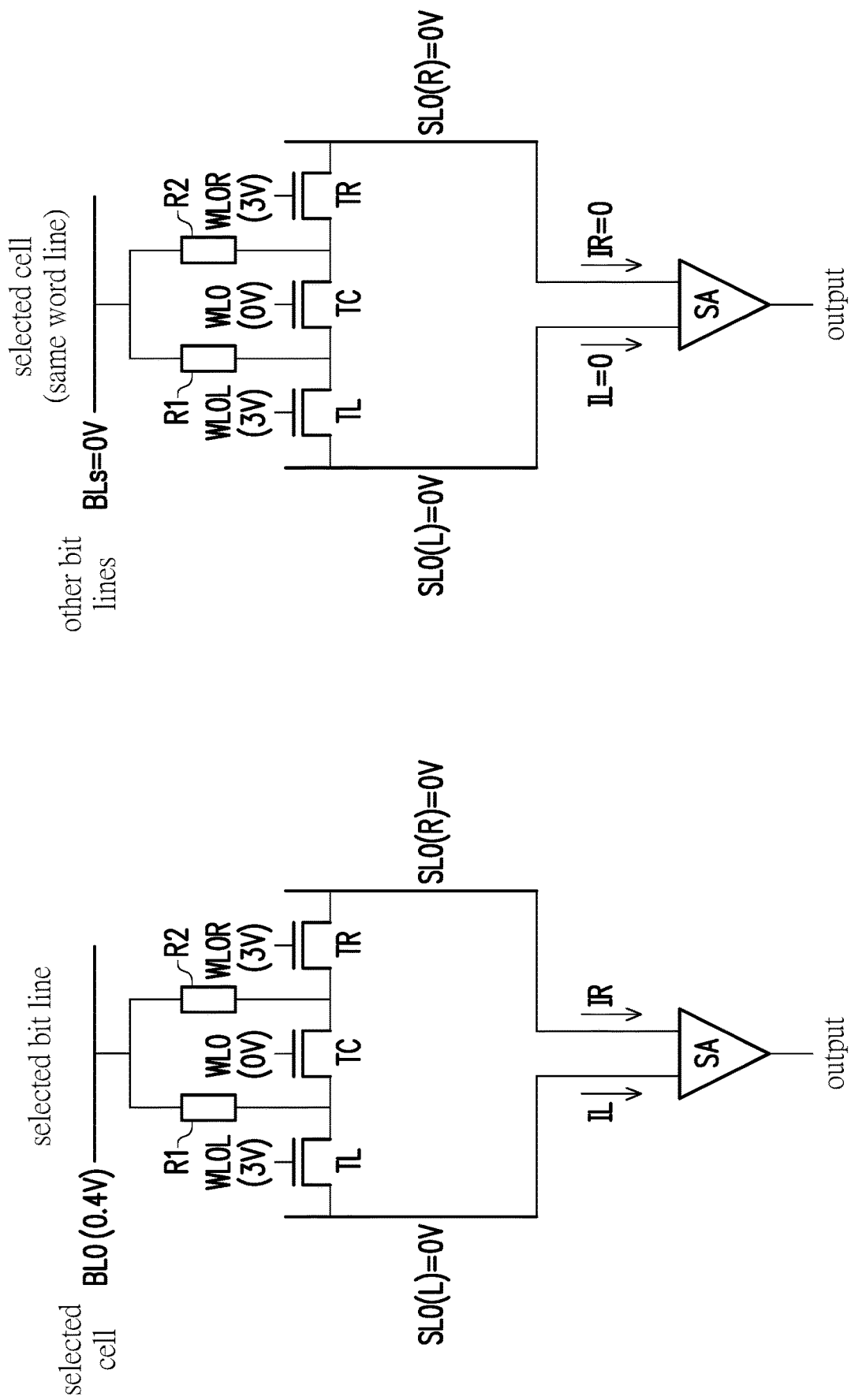

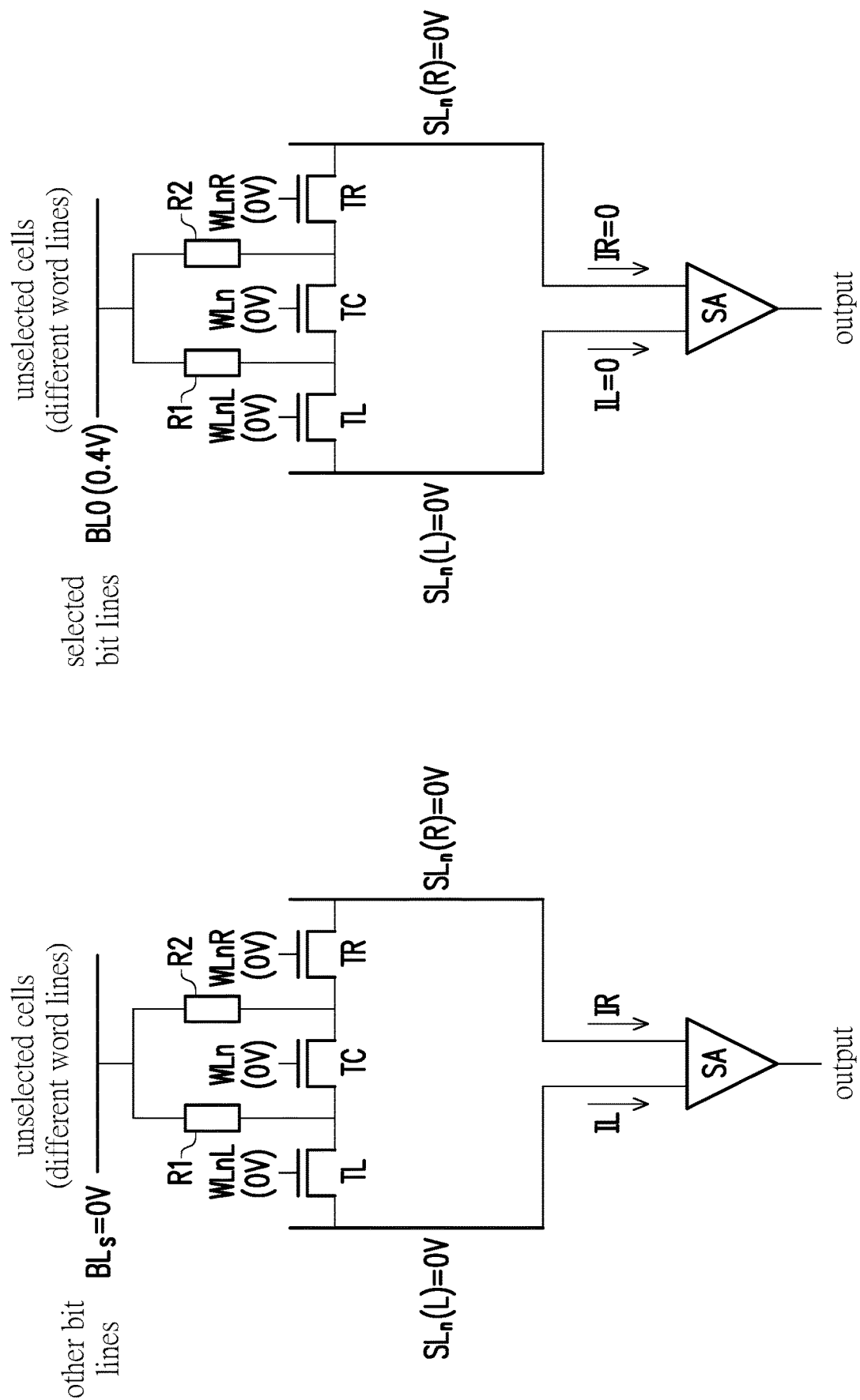

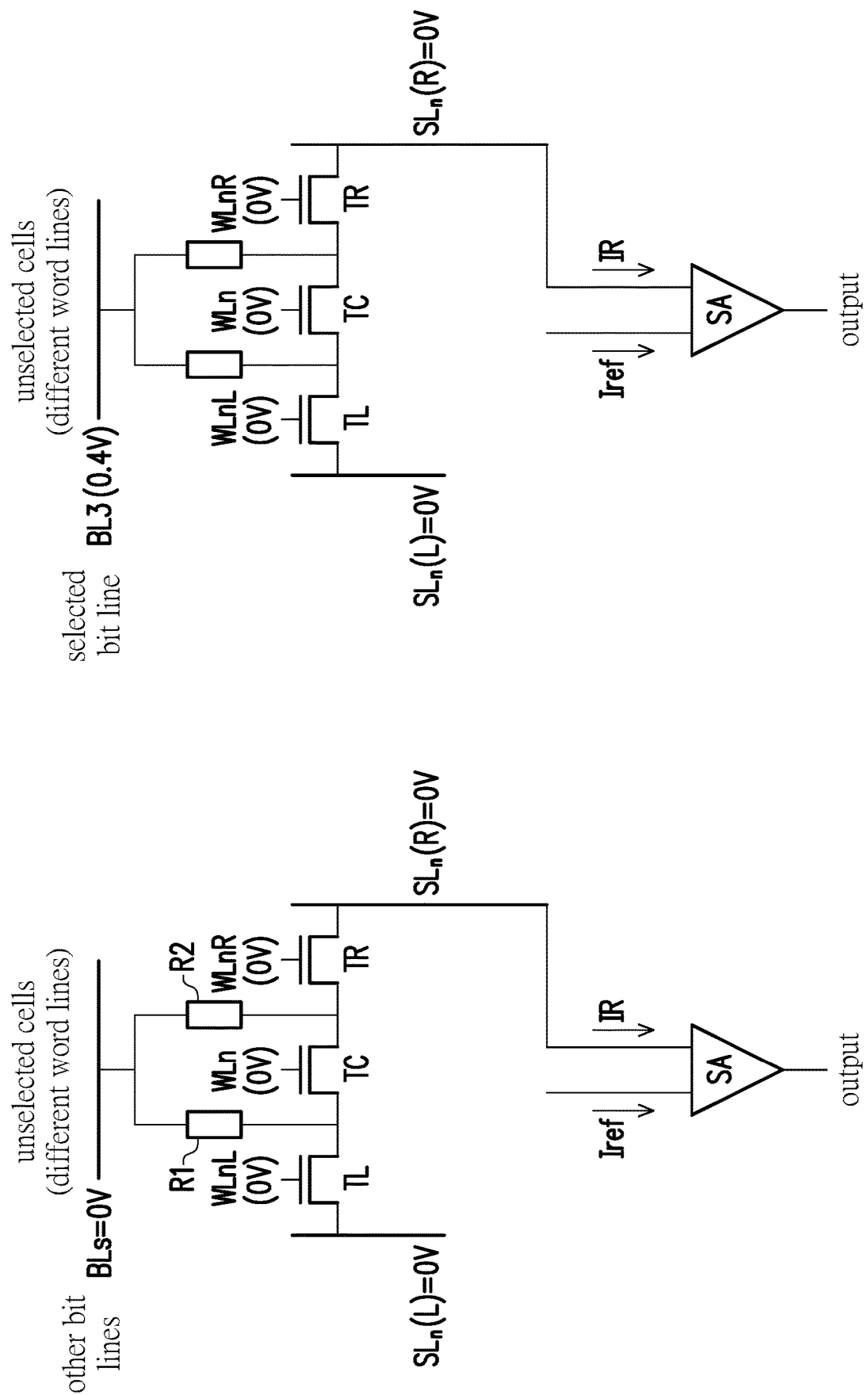

MEMORY ARRAY AND OPERATION METHOD THEREOF

BACKGROUND

Technical Field

The present invention relates to a memory array and an operation method thereof.

Description of Related Art

Physical unclonable functions (PUF) memory is currently widely used in applications such as digital ID cards. In the existent art, there are several ways for configuring the PUF memory, such as using the mismatching behaviors of devices in the manufacturing process, or using SRAM or ring oscillator. For the SRAM, it utilizes the voltage difference between the bit line pairs (BL/BL) of the memory to identify 0 or 1, and the ring oscillator can use two paths to compare and determine which path is faster to produce 0 or 1.

In order to avoid device mismatch behavior, many new types of the PUF memory have been proposed. When designing the PUF memory, there must be a 50% probability to produce 0 or 1.

SUMMARY

Based on the above reasons, the present invention provides a memory array that can be used as PUF memory. The memory array can also provide a differential or single-ended operation mode, which can provide about a 50% success probability and has good PUF application properties.

According to one embodiment of the present invention, a memory array is provided, which includes: a plurality of sets of word lines, wherein each set of the plurality of sets of word lines comprises a first word line, a second word line, and a third word line; a plurality of bit lines and a plurality of sets of source lines; and a plurality of memory cells, each of the plurality of memory cells is respectively arranged at an intersection of the plurality of sets of word lines and the plurality of bit lines. Each memory cell comprises a first and a second conductive filament components and a switch circuit, and one ends of the first and the second conductive filament components are coupled to a corresponding bit in the plurality of bit lines, other ends of the first and the second conductive filament components are coupled to the switch circuit. After each of the plurality of memory cells is subject to a filament forming, one of the first and the second conductive filament components is formed to create a conductive filament, and the other is in a high resistance state. When the memory array is operated in a differential mode, reading is performed according to reading currents of the first and second conductive filament component. When the memory array is operated in a single-ended mode, reading is performed according to a reading current of the first or the second conductive filament component which forms a conductive filament and a reference current.

According to another embodiment of the present invention, an operating method of a memory array is provided. The memory array comprises: a plurality of sets of word lines, wherein each set of the plurality of sets of word lines comprises a first word line, a second word line, and a third word line; a plurality of bit lines and a plurality of sets of source lines; and a plurality of memory cells, each of the plurality of memory cells is respectively arranged at an intersection of the plurality of sets of word lines and the plurality of bit lines, each memory cell comprises a first and a second conductive filament components and a switch circuit, and one ends of the first and the second conductive filament components are coupled to a corresponding bit in the plurality of bit lines, other ends of the first and the second conductive filament components are coupled to the switch circuit. The operation method includes: performing a filament forming on each of the plurality of memory cells, wherein one of the first and second conductive filament components is formed to create a conductive filament after the filament forming is finished, and the other one of the first and second conductive filament components is in a high resistance state; and operating the memory array in a differential mode or a single-ended mode to read each of the plurality of memory cells. When the memory array is operated in the differential mode, reading is performed according to a first reading current of the first conductive filament component and a second reading current of the second conductive filament component. When the memory array is operated in the single-ended mode, reading is performed according to a reading current of the first or the second conductive filament component which forms a conductive filament and a reference current.

In summary, according to the embodiments of the present invention, a memory array configuration can be provided, which is suitable for the operation of PUF memory. The memory array of the embodiment can provide two read modes of differential mode and single-ended mode, providing more flexible operation. In addition, the memory array of the present invention can provide a better resolution, and the probability that each of the two conductive filament components can be successfully formed can be 50%, which is suitable for the application of PUF memory.

BRIEF DESCRIPTION OF THE DRAWINGS

FIGS. 5A to 5D respectively illustrate the read operation states of various memory cells for the combination of selected/unselected word lines and selected/unselected bit lines.

FIGS. 7A to 7D respectively illustrate the read operation states of various memory cells for the combination of selected/unselected word lines and selected/unselected bit lines.

DESCRIPTION OF THE EMBODIMENTS

Figure 1:
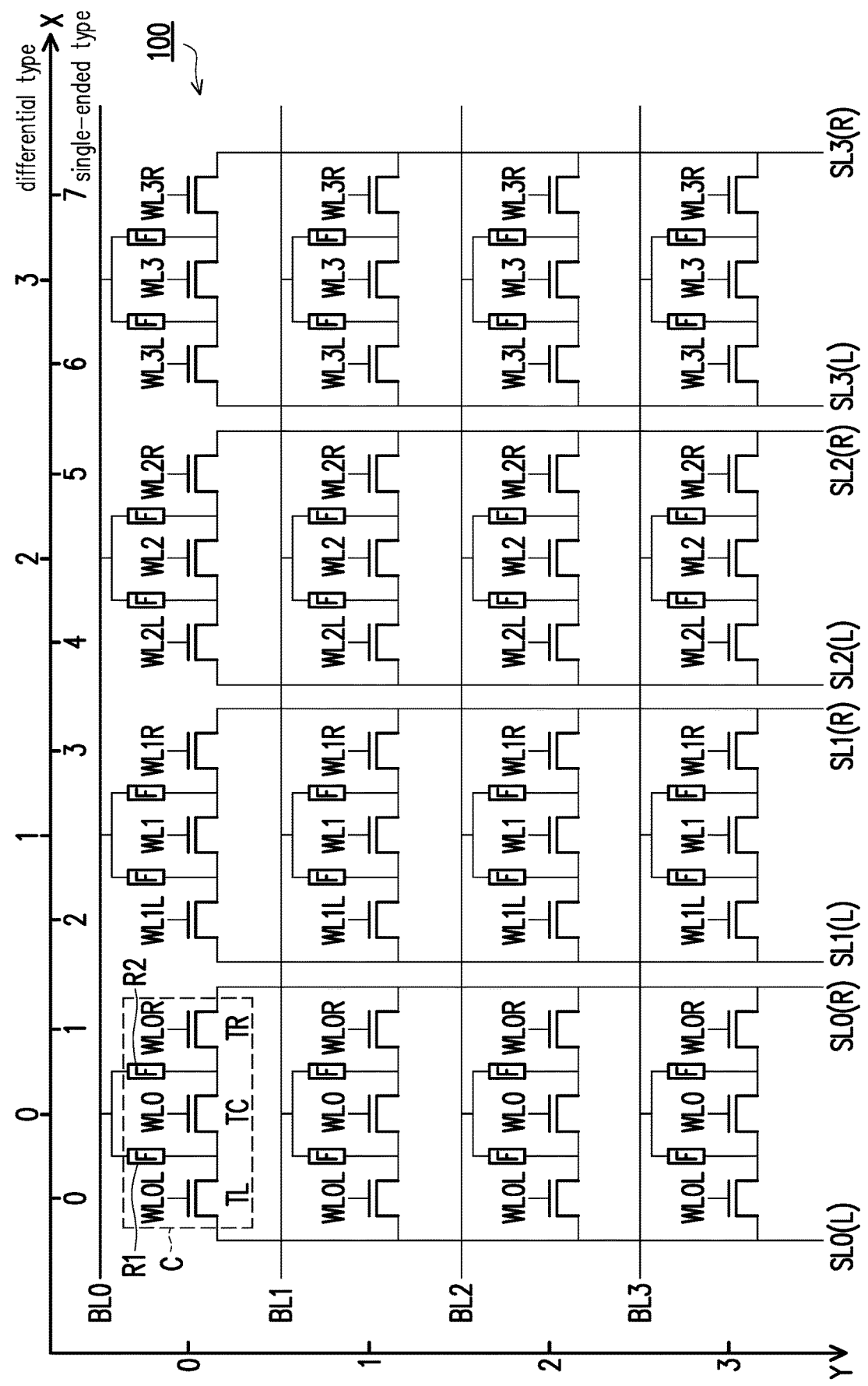
FIG. 1 is a schematic diagram of the structure of a memory array according to an embodiment of the present invention.

As shown in FIG. 1, the memory array 100 includes a plurality of sets of word lines WL0/WL0R/WL0L~WL3/WL3R/WL3L, a plurality of bit lines BL0~BL3, a plurality of sets of source lines SL0(L)/SL0(R) SL3(L)/SL3(R), and a plurality of memory cells C. The plurality of sets of word lines WL0/WL0R/WL0 L~WL3/WL3R/WL3L extends in the first direction (for example, the column direction), and the plurality of bit lines BL0~BL3 extends in the second direction (for example, the row direction). Each of the plurality of memory cell C is arranged at the intersection of the plurality of word lines WL0/WL0R/WL0L WL3/WL3R/WL3L and the plurality of bit lines BL0 BL3. In this embodiment, the memory array 100 uses a 4×4 (4 sets of word lines and 4 bit lines) array as an example, but it is not intended to limit the implementation of the present invention.

As shown in FIG. 1, the plurality of memory cells C may be a resistive memory cells, each memory cell C includes a pair of conductive filament component (first and second conductive filament components) R1, R2, and a switching circuit including transistors TC, TL, and TR. One end of each conductive filament component R1, R2 is coupled to the corresponding bit line, and the other end of each conductive filament component R1, R2 is coupled to the switch circuit. The switch circuit is coupled to a corresponding set of source lines. Specifically, the switch circuit includes three transistors TC, TL, and TR that are connected in series. Using the memory cell C in the upper-left corner of the memory array 100 as an example, the transistor TC is used as a common transistor for the first and second conductive filament components R1 and R2, and the gate of the transistor TC is coupled to the word line WL0 of a set of word lines. One source/drain end of the transistor TL is coupled to the corresponding source line SL0(L), the other source/drain end is coupled to a source/drain end of the common transistor TC, and the gate of the transistor TL is coupled to the word line WL0L of the same set of word lines. One source/drain end of the transistor TR is coupled to the corresponding source line SL0(R), the other source/drain end is coupled to the other source/drain end of the common transistor TC, and the gate of the transistor TR is coupled to the word line WL0R of the same set of word lines. The set of word lines includes word lines WL0, WL0L, and WL0R, which are respectively used to drive the transistors TC, TL, and TR.

In addition, the first end of the first conductive filament component R1 of each memory cell C is coupled to the corresponding bit line BL0, and the second end is coupled to the one source/drain end of the transistor TC and the other source/drain end of the transistor TL. The first end of the second conductive filament component R2 of each memory cell C is coupled to the corresponding bit line BL0, and the second end is coupled to the other source/drain end of the transistor TC and the one source/drain end of the transistor TR.

According to the embodiment of the present invention, when performing the forming operation on each memory cell, the transistors TL, TC, and TR of the switch circuit are turned on at the same time. In addition, when performing a read operation on the memory array 100, the common transistor TC is turned off, and only the transistors TL and TR are turned on. During the forming operation, only one of the first and the second conductive filaments R1, R2 will be formed to be the conductive filament F (as a resistance component), and the other one will not be formed (as a capacitive component). Therefore, the configuration of (R1, R2) in each memory cell C can be (resistor R, capacitor C) or (capacitor C, resistor R).

In addition, the success probability of forming (resistor) for each conductive filament is about 50%, which is sufficient for the application of physically non-reproducible functions. Here, the conductive filament components R1, R2 of the memory cell C may use, for example, materials of transition metal oxide (Transition Metal Oxide, TMO), but it is not intended to limit the implementation of the present invention, as long as the material can form the conductive filament.

In addition, the memory array of this embodiment includes two structures, one is a differential structure, and the other is a single-ended structure. When operating in the differential structure, each memory cell C is read by a 3T2R configuration with 3 transistors (TL, TC, TR) and 2 resistors (R1, R2), that is, a 3T2R memory cell structure is used as a logical 1 bit. When operating in the single-ended structure, each memory cell is read by a 1.5T1R configuration with 1.5 transistors (TL or TR and 0.5TC) and one resistor (R1 or R2), that is, 1.5T1R memory cell structure is used as a logical 1 bit. The detail read operation will be described in further detail below.

For convenience of the following description, the position of the memory cell C will be represented by (X, Y) coordinates. In the 4×4 memory array shown in FIG. 1, in the case of the differential structure, it will be expressed as X=0~3 (4 bits), and in the case of the single-ended structure, it will be expressed as X=0~7 (8 bits).

Figure 2:
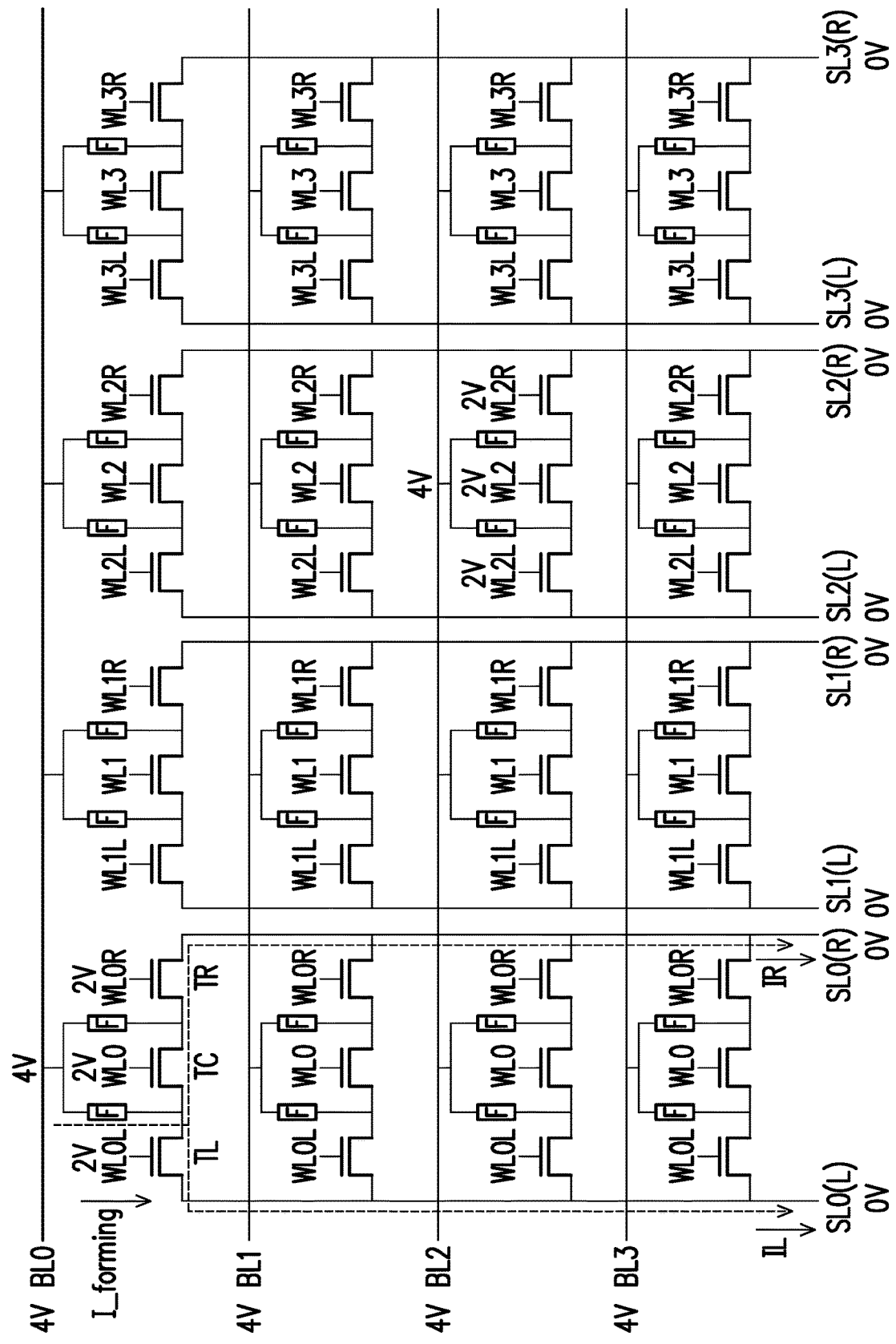
FIG. 2 is a schematic diagram illustrating the overall forming operation of the memory array according to an embodiment of the present invention.

Referring to FIG. 2, when operating the memory array (such as reading), firstly, all the memory cell of the memory array need to be integrally performed by the forming operation. The memory array 100 in FIG. 2 illustrates a 4×4 matrix (4 sets of word lines and 4 bit lines) as an example, but it is not intended to limit the embodiment of the present invention. The size of the memory array can be adjusted according to requirements.

As shown in FIG. 2, a bit line forming voltage, such as 4V, is applied to all bit lines BL0~BL3, and a source line forming voltage, such as 0V, is applied to all source lines SL0(R)~SL3(R), SL0(L)~SL3(L). In addition, a word line forming voltage is applied to the selected word lines, for example, a voltage of 2V is applied to the word lines WL0, WL0R, and WL0L. In this way, the filament forming is performed on the conductive filament component R1 or R2. In this process, for each memory cell C, only one of the conductive filament components R1, R2 will be formed into the conductive filament F, and the other one will not be formed. After forming the memory cells on all the word lines, the forming operation of all the memory cells of the memory array is completed.

In addition, usually the size of the memory array used as PUF memory is not too large. Therefore, when performing the forming operation on the memory array, voltages can be applied to all the word lines and bit lines, so that the forming operation can be applied to all memory cells of the memory array. In addition, if the size of the memory array used as PUF memory cannot be subject to the forming operation to all memory cells, the memory array can also be divided into several smaller sub-arrays, and then all memory cells of each sub-array can be formed.

The forming operation for each memory cell will be described with reference to FIGS. 3A to 3C. As shown in FIG. 3A, any one of the memory cells shown in FIG. 2 is formed, taking the memory cell located at the intersection of the word lines WL0L, WL0, WL0R and the bit line BL0 as an example. During the forming operation, a voltage of about 2V is applied to the word lines WL0L, WL0, and WL0R, a voltage of about 4V is applied to the bit line BL0 that is coupled to the two conductive filament components R1, R2, and a voltage of 0V is applied to the source line SL0(L) coupled with the source of the transistor TL and the source line SL0(R) coupled with the source of the transistor TR. Under this bias condition, the filament forming of the conductive filament components R1 and R2 can be started. At this time, although the bias voltage is applied, the two conductive filament components R1 and R2 have not been formed yet, and the probability of each of them being formed into the conductive filament F is about 50%. The label in the figure only represents that one of the conductive filament components R1 and R2 will be formed into the conductive filament F.

As shown in FIG. 3B, in the formed state, if the conductive filament component R1 on the left penetrates the energy barrier first, the conductive filament will be formed faster and becomes conductive first, then the conductive filament component R2 on the right side will not be formed and conductive, at this time, the conductive filament component R2 on the right will maintain a very high resistance state (for example, like a capacitor). FIG. 3C shows an equivalent circuit diagram of the formed state, with an example that the conductive filament F is formed by the conductive filament component R1 on the left.

As shown in FIG. 3C, in the forming racing, the conductive filament component R1 on the left is first formed to create the conductive filament F, and finally is equivalent to the resistor R, while the conductive filament component R2 on the right is not formed, and can be equivalent to the capacitor C. According to the embodiment of the present invention, when operating the memory array at the beginning, all memory cells are formed according to the above-mentioned method.

Because the transistor TC is provided, a common gate is provided, which makes the paths to the ground can be shortened. Because under this configuration, the current paths may have unequal lengths due to the process layout, and the common gate configuration can make the paths to the ground for the unformed conductive filaments components R1 and R2 on the left and right more consistent. In addition, because electrons take a shorter path during the forming process, once the conductive filament component on one side (such as R1) is formed, the conductive filament component on the other side (such as R2) will not be conductive and become high resistance state. In other embodiments, the transistor TC may not be provided.

Next, the reading method of the memory array according to the embodiment of the present invention will be described. As mentioned above, the memory array 100 can provide two different reading methods, one is the differential type (i.e., 3T2R architecture), and the other is the single-ended type (i.e., 1.5T1R architecture).

Figure 4:
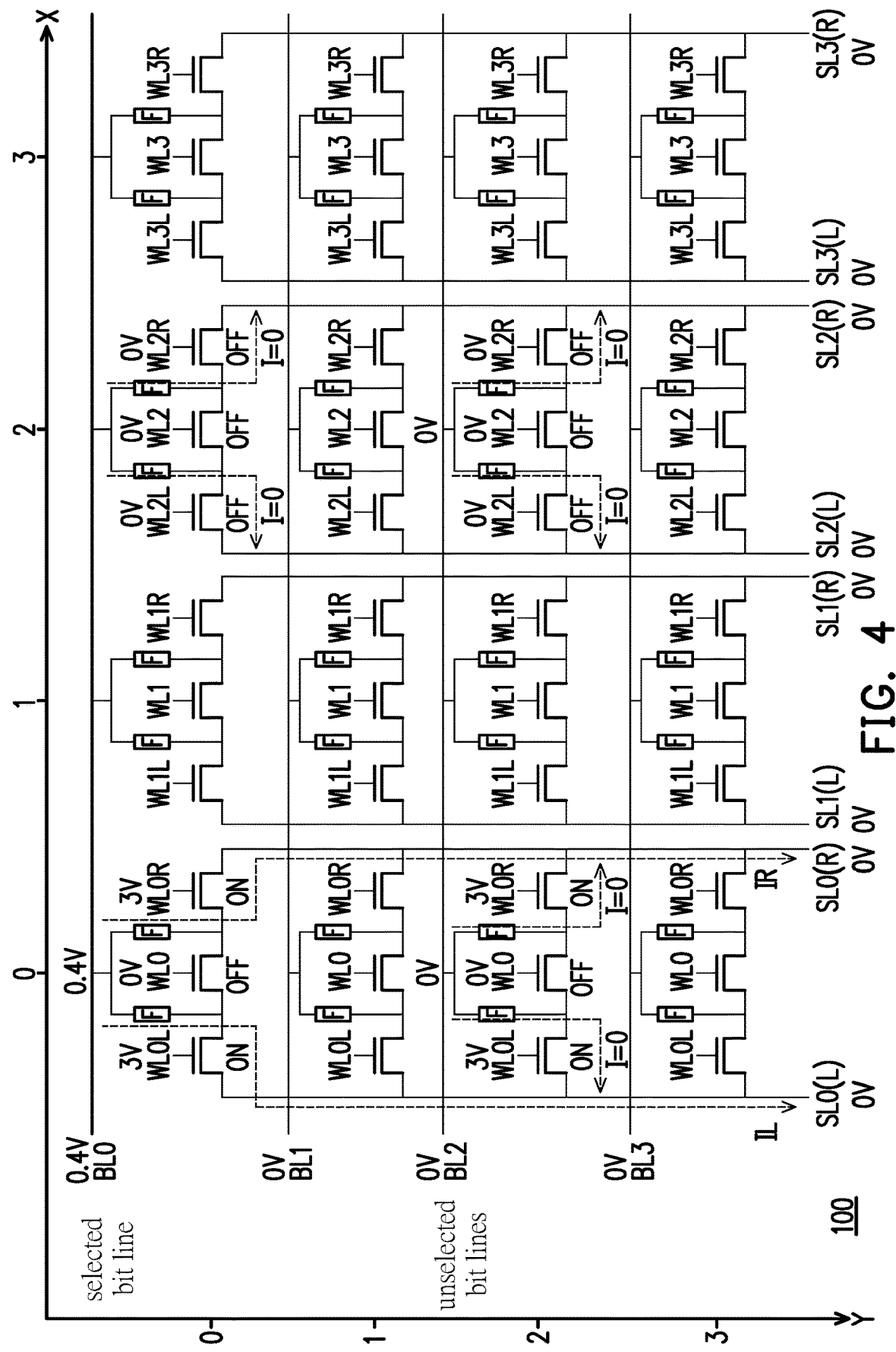
FIG. 4 illustrates a schematic diagram of a bias voltage application in a read method of a memory array in a differential mode according to an embodiment of the present invention.

FIG. 4 is a schematic diagram showing the bias voltage application method of the read method of the memory array in the differential mode. As shown in FIGS. 4 and 5A, assume the memory cell at (X, Y)=(0, 0) is to be read, that is, the memory cell at the intersection of the word lines WL0, WL0L, WLR and the bit line BL0 is selected to be read, and the other memory cells are not selected. Therefore, in the memory array 100, only the bit line BL0 is applied with the bit line read voltage of about 0.4V, and the other unselected bit lines BL1 to BL3 are applied with a voltage of 0V. The source lines SL0(L)·SL3(L) and SL0(R)·SL3(R) are all applied with a voltage of 0V (grounded). In addition, the selected word lines WL0R and WL0L are applied with a word line read voltage of 3V, and the word line WL0 is applied with a voltage of 0V to turn off the common transistor TC. The source lines SL0(L) and SL0(R) are respectively connected to the two input ends of the sense amplifier SA.

Because only one of the conductive filament components R1 and R2 will be formed to create a conductive filament, therefore, after the transistors TL and TR are turned on, the reading currents IL and IR corresponding to the conductive filament components R1 and R2 will flow into the two input ends of the sense amplifiers SA through the source lines SL0 (L) and SL0 (R), respectively. In this way, the difference between the two reading currents IL and IR is compared to determine whether the bit stored in the memory cell is 1 or 0. As mentioned above, because the conductive filament component to which the conductive filament is not formed will behavior like a capacitor with a high resistance capacitor, the reading current corresponding to this conductive filament component will be small. Therefore, the order (IL:IR) of the reading current IL and IR is about (µA:n~pA) or (n~pA:µA).

FIG. 5B shows the read state of the memory cells at the intersections of the selected word line and the other unselected bit lines (BL1~BL3) in FIG. 4, for example, the memory cell at (X, Y)=(0,2). At this time, the memory cell (0, 2) and the memory cell (0, 0) are in the same column, and in the same way, the word line WL0L and WL0R are applied with the word line read voltage of 3V, and the common transistor TC is turned off, and the unselected bit line BL2 is applied with 0V. The source lines SL0(L) and SL0(R) are connected to the two input ends of the sense amplifier SA. Because the bit line BL2 and the source lines SL0(L) and SL0(R) are all 0V, therefore, even if the 3V voltage is applied to the gates of the transistors TL and TR, the transistors TL and TR are turned on, however, the reading currents IL, IR will not generate on the current paths from the conductive filament components R1 and R2 to the source lines SL0(L) and SL0(R) through the transistors TL and TR, that is, IL=IR=0.

FIG. 5C shows the read state of the memory cells at the intersections of the unselected word lines (WLnL, WLn, WLnR, n≠0) and the unselected bit lines (BL1~BL3) in FIG. 4, such as the memory cell (X, Y)=(2, 2) in FIG. 4. At this time, 0V is applied to the unselected bit line BL2, and 0V is applied to the unselected word lines WL2L and WL2R, and the common transistor TC is turned off. The source lines SL0(L) and SL0(R) are connected to the two input ends of the sense amplifier SA. Because the transistors TL and TR of the memory cell (2, 2) are turned off, the reading currents IL, IR will not generate on the current paths from the conductive filament components R1 and R2 through the transistors TL and TR to the source lines SL0(L), SL0(R), that is, IL=IR=0.

FIG. 5D shows the memory cells at the intersections of the unselected word line (WLnL, WLn, WLnR, n≠0) and the selected bit line (BL0) shown in FIG. 4, such as the memory cell (X, Y)=(2,0). At this time, the memory cell (2, 0) and the memory cell (0, 0) are in the same row, and in the same manner, the selected bit line BL0 is applied with a voltage of 0.4V, and the word lines WL2L and WL2R are applied with a voltage of 0V. The common transistor TC is turned off. The source lines SL0(L) and SL0(R) are connected to the two input ends of the sense amplifier SA. Because the transistors TL and TR of the memory cell (2, 0) are turned off, the reading currents IL, IR will not generate on the current paths from the conductive filament components R1 and R2 through the transistors TL and TR to the source lines SL0 (L), SL0 (R), that is, IL=IR=0.

Figure 6:
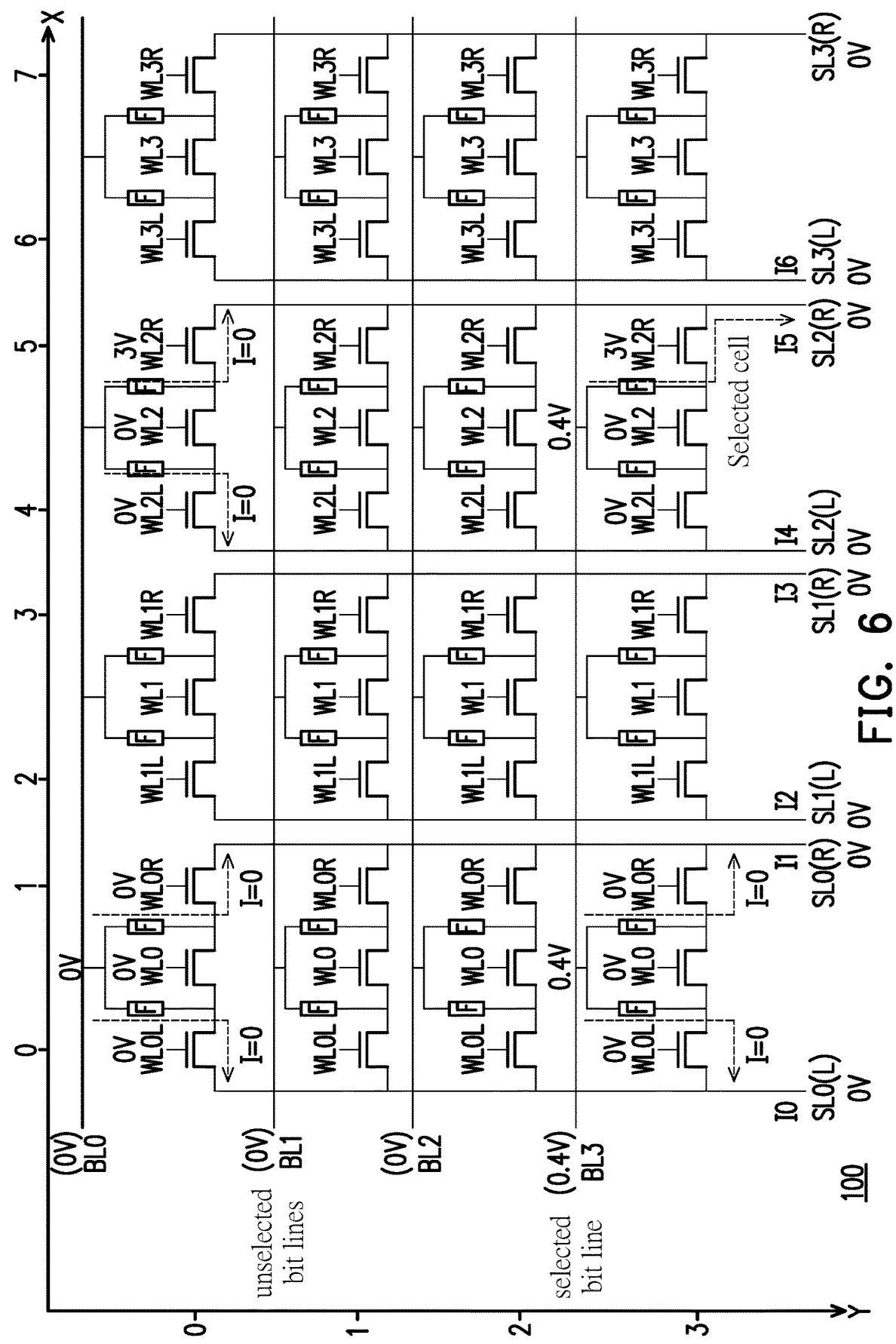
FIG. 6 is a schematic diagram of a bias voltage application in a read method of a memory array in a single-ended mode according to an embodiment of the present invention.

FIG. 6 is a schematic diagram showing the bias voltage application method of the read method of the memory array in the single-ended mode. Assume the memory cell at (X, Y)=(5, 3) is to be read, that is, the memory cell on the right at the intersection of the word line WL2, WL2L, WL2R and the bit line BL3 is selected to be read (that is, it is assumed that during the forming operation, the conductive filament component R2 on the right is formed into the conductive filament), the other memory cells are in the unselected state. Therefore, in the memory array 100, only the bit line BL3 is applied with the bit line read voltage of about 0.4V, and the other unselected bit lines BL0~BL2 are applied with 0V. The source lines SL0(L)~SL3(L) and SL0(R)~SL3(R) are all applied with a voltage of 0V (grounded). In addition, the selected word line WL2R is applied with the word line read voltage of 3V, and at the same time, a 0V voltage is applied to the word lines WL2L and WL2 to turn off the transistor TL and the common transistor TC.

Figures 7A, 7B:
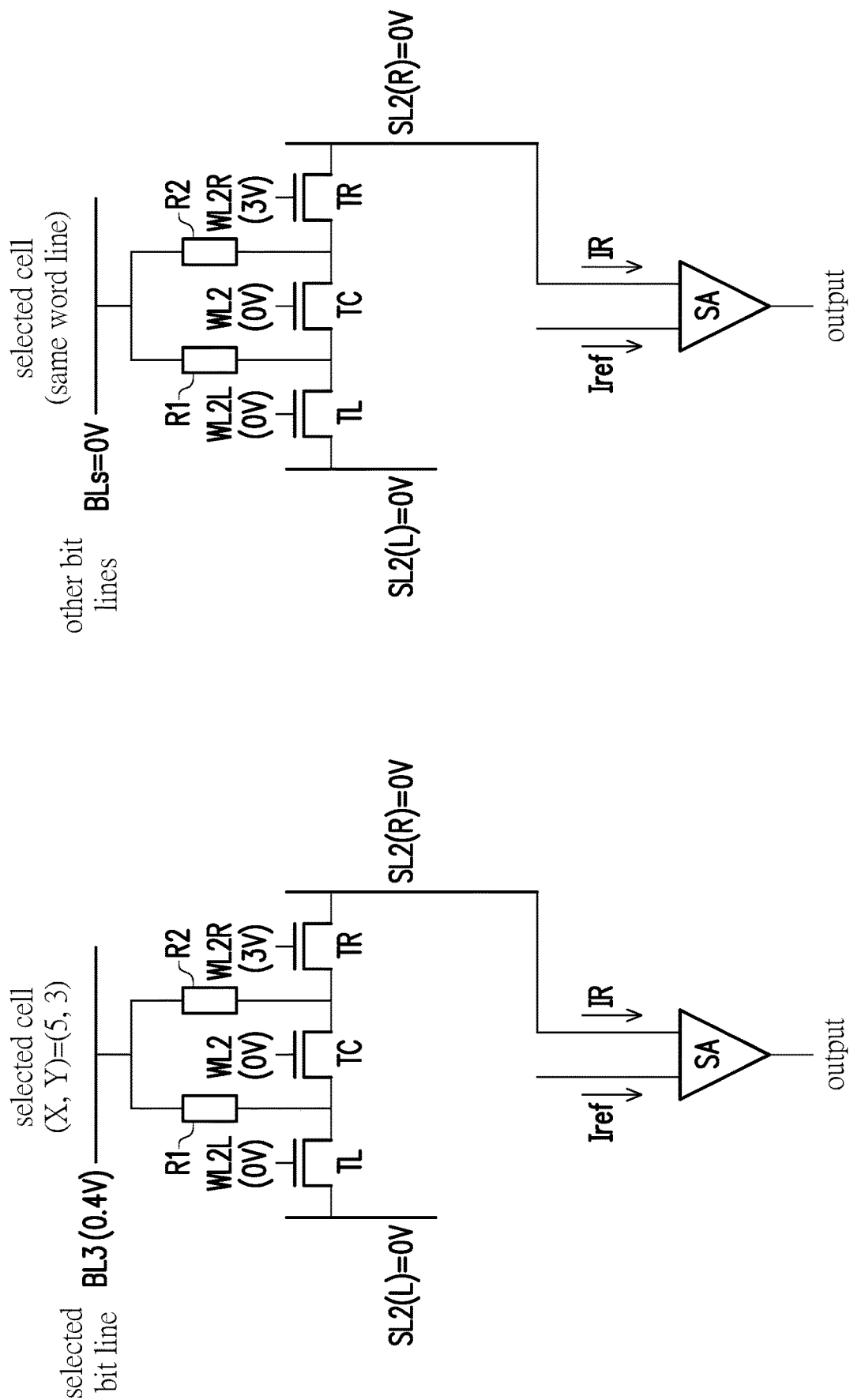

As shown in FIG. 7A, when reading in the single-ended mode, only the source line SL2 (R) corresponding to the formed conductive filament component R2 is connected to an input end of the sense amplifier SA, the source line SL2 (L) is not connected to the sense amplifier SA. In addition, the other input end of the sense amplifier SA is coupled to the reference current Iref. The conductive filament component R2 is formed into the conductive filament, and during reading operation, only the transistor TR is turned on, and the reading current I5 corresponding to the conductive filament component R2 flows into the input end of the sense amplifier SA from the source line SL2 (R), in this way, the difference between the reading current I5 and the reference current Iref is compared to determine whether the bit stored in the memory cell is 1 or 0.

FIG. 7B shows the read state of the memory cell at the intersections of the selected word line and other unselected bit lines (BL0~BL2) in FIG. 6, for example, the memory cell(X, Y)=(5, 0) in FIG. 6. At this time, the memory cell (5, 0) and the memory cell (5, 3) are in the same column, and a voltage of 0V is applied to the word lines WL2L and WL2 to turn off the transistor TL and the common transistor TC, and a voltage of 0V is applied to the unselected bit line BL0. Similarly, only the source line SL2 (R) is connected to the input end of the sense amplifier SA, and the source line SL2 (L) is not connected to the sense amplifier SA. In addition, the other input end of the sense amplifier SA is coupled to the reference current Iref. Because the bit line BL0 and the source line SL2(R) are both 0V, even though the gate of the transistor TR is applied with a voltage of 3V to be turned on, the reading current I5 will not generate on the current path from the conductive filament component R2 through the transistor TR to the source line SL2(R), that is, I5=0.

FIG. 7C shows the read state of the memory cells at the intersections of the unselected word lines (WLnL, WLn, WLnR, n≠0) and the unselected bit lines (BL1~BL3) in FIG. 6, such as the memory cell (X, Y)=(1, 0). At this time, for example, a voltage of 0V is applied to the unselected bit line BL0, and a voltage of 0V is applied to the unselected word lines WL0L and WL0R, and the common transistor TC is turned off. The source line SL0(R) is connected to an input end of the sense amplifier SA, and the source line SL2(L) is not connected to the sense amplifier SA. In addition, the other input end of the sense amplifier SA is coupled to the reference current Iref. Because the transistors TL, TC, and TR of the memory cell (1, 0) are turned off, the reading current IR will not generate on the current path from the conductive filament component R2 through the transistor TR to the source line SL0(R) generate, that is, IR=0.

FIG. 7D shows the memory cells at the intersections of the unselected word line (WLnL, WLn, WLnR, n≠0) and the selected bit line (BL3) in FIG. 6, such as the memory cell (X, Y)=(1,3). At this time, the memory cell (1, 3) and the memory cell (5, 3) are in the same row, and in the same manner, the selected bit line BL3 is applied with 0.4V, and the word lines WL0L and WL0R are applied with a voltage of 0V, and the common transistor TC is turned off. The source line SL0(R) is connected to an input end of the sense amplifier SA, and the source line SL0(L) is not connected to the sense amplifier SA. In addition, the other input end of the sense amplifier SA is coupled to the reference current Iref. Because the transistors TL and TR of the memory cell (1, 3) are turned off, the reading current IR will not generate on the current path from the conductive filament component R2 through the transistor TR to the source line SL0(R), that is IR=0.

When operating the memory array 100, the controller of the memory array 100 can issue a command of read type to determine the row decoding mode of the memory array 100. For example, in the example of the memory array 100 shown in FIG. 1, if the command of read type is set to the differential mode, the memory array 100 will be regarded as a 4×4 matrix (the memory cell is 3T2R). If the command of read type is set to a single-ended mode, the memory array 100 will be regarded as an 8×4 matrix (the memory cell is 1.5T1R).

In addition, in the single-ended mode, a switch can be used to switch the input source of the input ends of the sense amplifier SA in each column of the memory array 100. That is, in the differential mode, the two input ends of the sense amplifier SA are respectively coupled to the source lines SLn(L) and SLn(R) to receive the reading currents from the conductive filament components R1, R2, respectively. However, in the single-ended mode, one input end of the sense amplifier SA is coupled to one of the source lines SLn(L) and SLn(R), and the other input end of the sense amplifier SA can be switched to the reference current Iref by the above-mentioned switch.

Figure 3:
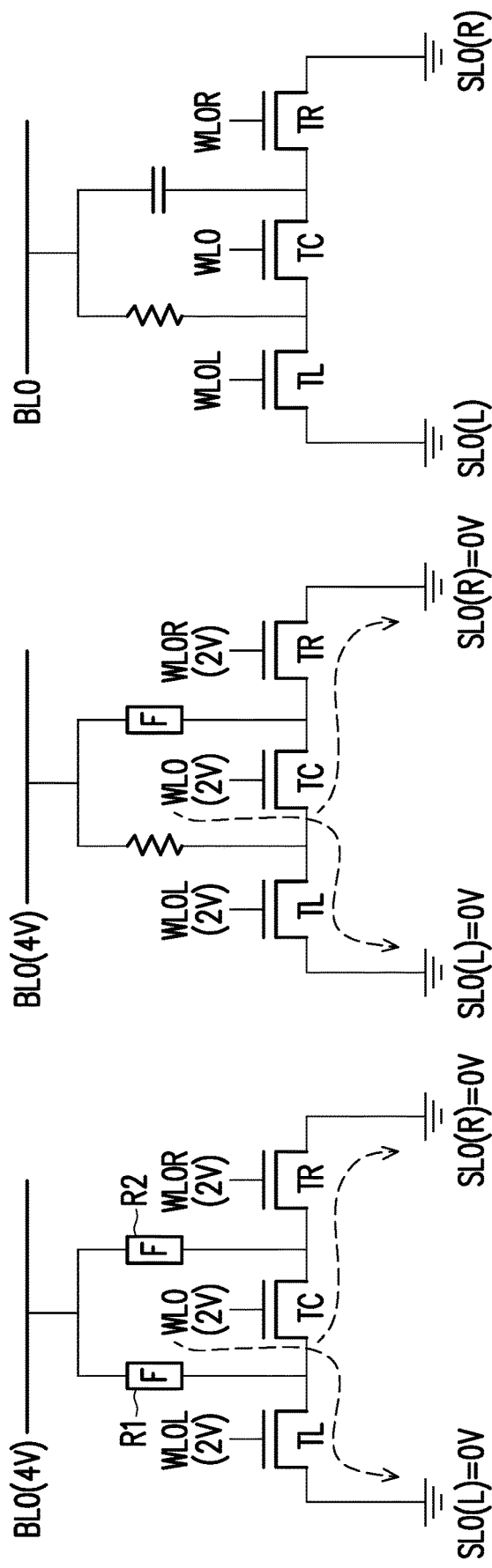
FIGS. 3A to 3C are schematic diagrams illustrating a process of forming operation on a memory cell according to an embodiment of the present invention.
Figure 8A:
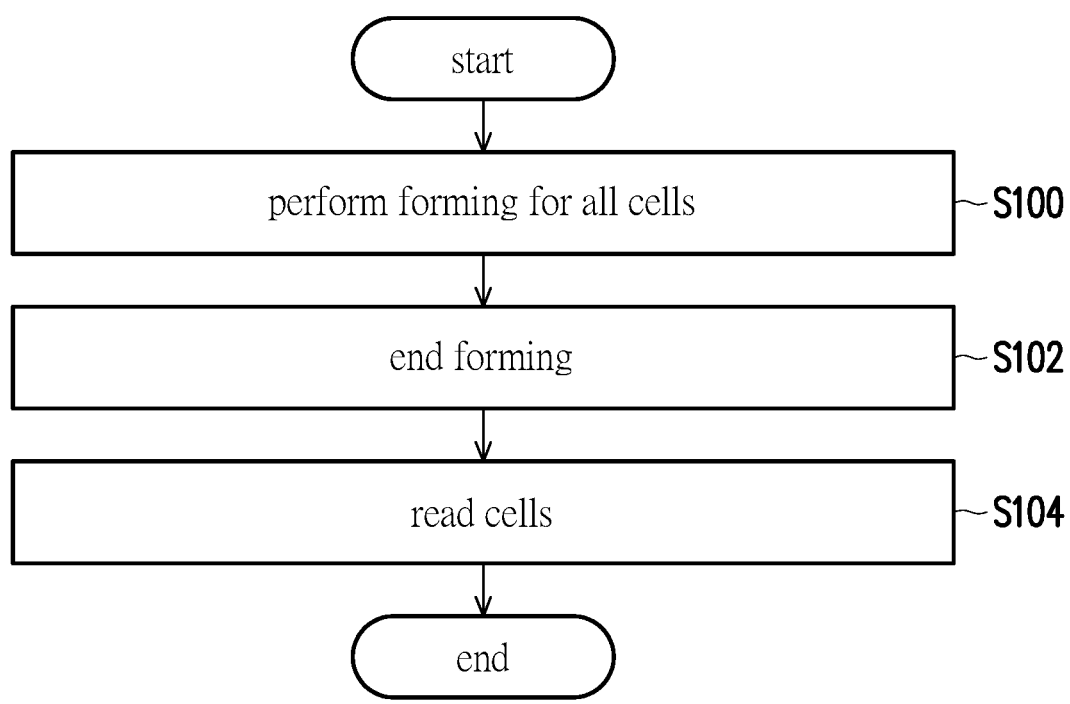
FIG. 8A is a schematic flowchart of a reading method using a memory array according to an embodiment of the present invention.

The process shown in FIG. 8A is the process of forming and reading memory cells before leaving the factory. As shown in FIG. 8A and FIG. 3, in step S100, all memory cells of the memory array 100 are performed the forming operation. During the forming process, the two conductive filament components R1 and R2 in each memory cell will be formed in a racing manner.

In step S102, after the forming is completed, only one of the two conductive filament components R1 and R2 will be successfully formed to produce the conductive filament, therefore, the resistance of the conductive filament component (for example, R1) can be reduced, while the other conductive filament component R2 is not successfully formed and result in a high resistance state, which is equivalent to a capacitor. After the forming, which one of the conductive filament components R1, R2 is successfully formed is random.

In step S104, the memory cell is read. At this time, the reading in the differential mode as shown in FIG. 4 or the reading in the single-ended mode as shown in FIG. 6 may be utilized. The specific reading method can be referred to the descriptions of FIG. 5A to FIG. 5D or FIG. 7A to FIG. 7D. In this step, it can be set to provide only differential or single-ended mode to the user after leaving the factory, or both differential and single-ended modes can be provided to the user. After that, the operation flow is finished.

Figure 8B:
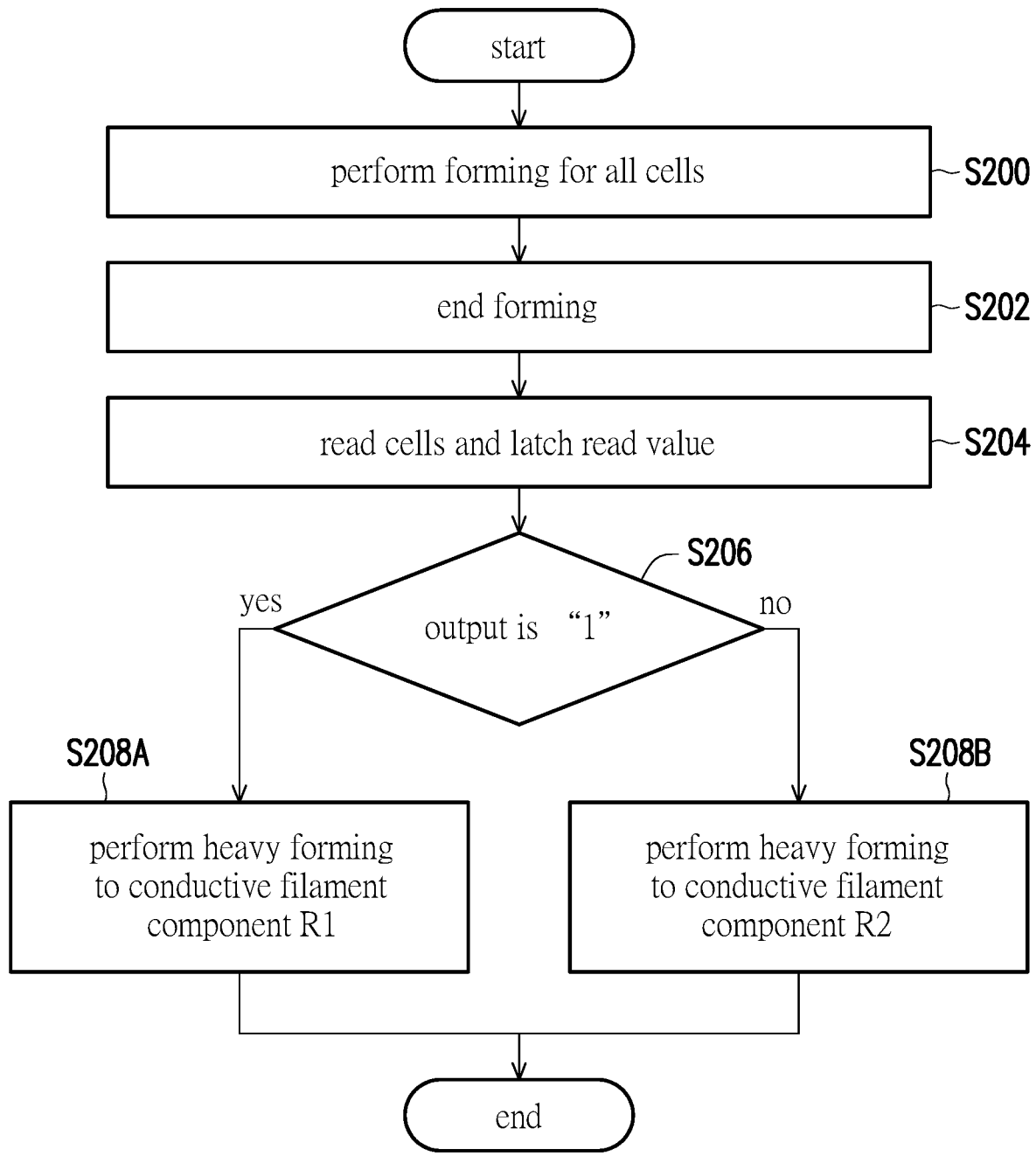
FIG. 8B is a schematic flowchart of a reading method using a memory array according to an embodiment of the present invention.

FIG. 8B is a schematic flowchart of a reading method using a memory array according to another embodiment of the present invention. As shown in FIG. 8B, steps S200 to S204 are basically the same as the operations of steps S100 to S104 in FIG. 8A. In addition, in step S204, the read value is latched when the memory cell is read. In this embodiment, a latch is further provided to latch the formed state. Generally speaking, the states of the two conductive filament components R1 and R2 are fixed after forming, that is, one will have a large current flowing (forming successful) therein, and the other will have a small current flowing (forming unsuccessful) therein. The latch will latch the state at the moment when the forming is finished.

In step S206, the magnitude of the reading current corresponding to the conductive filament components R1, R2 is determined. For example, when the conductive filament component R1 on the left can generate current Icell (L) is 32 µA and the conductive filament component R2 on the right can generate a current Icell (R) of 18 pA; in this case, Icell (L)>Icell (R), then "1" can be output. This situation indicates that the conductive filament component R1 on the left was successfully formed. For another example, when the conductive filament component R1 on the left can generate current Icell (L) is 15 pA and the conductive filament component R2 on the right can generate a current Icell (R) of 30 µA; in this case, Icell (L)<Icell (R), then "0" can be output. This situation indicates that the conductive filament component R2 on the right was successfully formed. Of course, the judgment condition can also be reversed to the above conditions. Here, it is mainly to judge which one of the conductive filament components R1 and R2 is successfully formed.

Therefore, the successfully formed conductive filament component can be further formed again. For example, in step S206, when the output comparison result is "1", it indicates that the conductive filament component R1 is successfully formed, so in step S208A a heavy forming is further performed to the conductive filament component R1. Conversely, in step S206, when the output comparison result is "0", it indicates that the conductive filament component R2 is successfully formed, so in step S208B a heavy forming is further performed to case, Icell the conductive filament component R2. In this way, the reading current of the conductive filament components R1 and R2 can be increased to the degree of resolution. Here, the heavy forming may be to form the conductive filament component R1 in a manner close to the breakdown voltage. For example, a voltage of 5V is applied to the gate of the transistor TL of the corresponding conductive filament component R1, a voltage of 4V is applied to the corresponding bit line BL, and a voltage of 0V is applied to the corresponding source line SL.

Figure 8C:
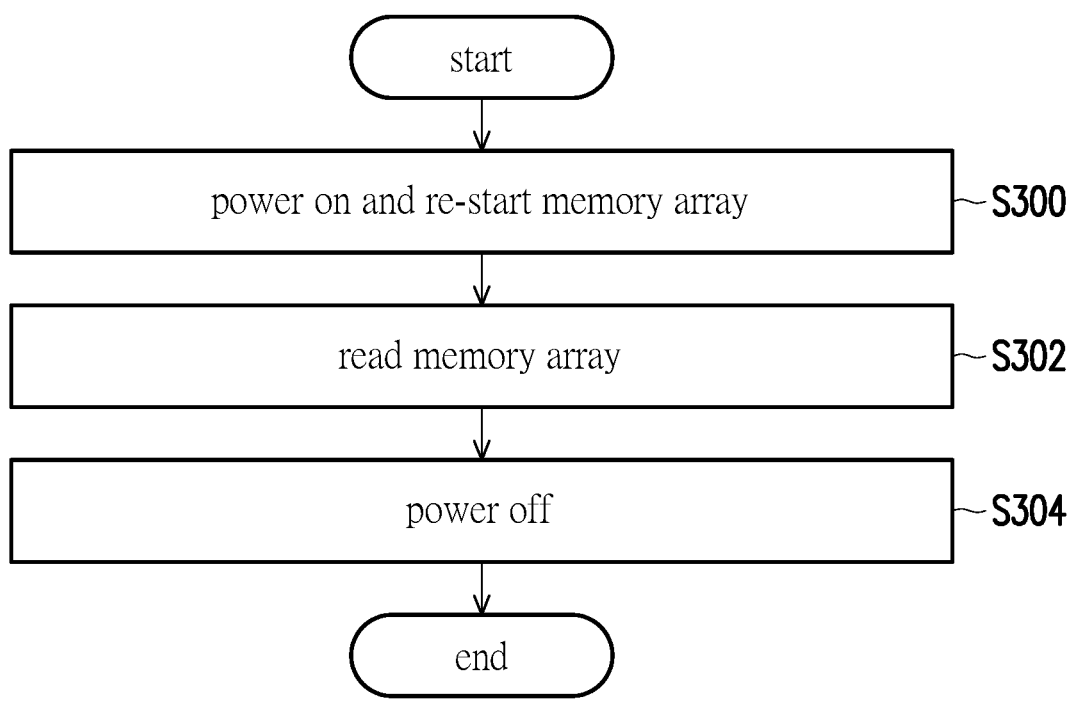
FIG. 8C is a schematic diagram of the reading process of the memory array after the factory setting in FIG. 8A or FIG. 8B.

FIG. 8C shows the operation flow of the memory on the user end after the factory setting in FIG. 8A or FIG. 8B. In step S300, the user can turn on the power of the memory to activate the PUF memory array 100 as shown in FIG. 1. After that, in step S302, the memory array can receive a read command to read the PUF memory array 100. This read operation can be the differential or single-ended mode. Finally, in step S304, the user can turn off the power of the memory array 100 to end the operation on the memory row.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory array, comprising:
   a plurality of sets of word lines, wherein each set of the plurality of sets of word lines comprises a first word line, a second word line, and a third word line;
   a plurality of bit lines and a plurality of sets of source lines; and
   a plurality of memory cells, each of the plurality of memory cells is respectively arranged at an intersection of the plurality of sets of word lines and the plurality of bit lines,
   wherein each memory cell comprises a first and a second conductive filament components and a switch circuit, and one ends of the first and the second conductive filament components are coupled to a corresponding bit in the plurality of bit lines, other ends of the first and the second conductive filament components are coupled to the switch circuit,
   after each of the plurality of memory cells is subject to a filament forming, one of the first and the second conductive filament components is formed to create a conductive filament, and the other is in a high resistance state,
   when the memory array is operated in a differential mode, reading is performed according to reading currents of the first and second conductive filament component, and
   when the memory array is operated in a single-ended mode, reading is performed according to a reading current of the first or the second conductive filament component which forms the conductive filament and a reference current.

2. The memory array according to claim 1, wherein the switch circuit comprises a first, a second, and a third transistors connected in series,
   one end of the first conductive filament component is coupled to the corresponding bit line and an other end of the first conductive filament component is coupled to a coupling point of the first and the second transistors, and one end of the second conductive filament component is coupled to the corresponding bit line, and an other end of the second conductive filament component is coupled to a coupling of the second and the third transistors.

3. The memory array according to claim 2, wherein in each of the plurality of memory cells coupled to the same set of word lines among the plurality of sets of word lines, a gate of the first transistor is coupled to the first word line, a gate of the second transistor is coupled to the second word line, and a gate of the third transistor is coupled to the third word line,
   a first source/drain end of the first transistor is coupled to a first source line of a corresponding set of source lines in the plurality of sets of source lines, and a second source/drain end of the first transistor is coupled to a first source/drain end of the second transistor and the other end of the first conductive filament component,
   a second source/drain end of the second transistor is coupled to a first source/drain end of the third transistor and the other end of the second conductive filament component, and a second source/drain end of the third transistor is coupled to a second source line of the corresponding set of source lines in the plurality of sets of source lines.

4. The memory array according to claim 2, wherein when the filament forming is performed to each of the plurality of memory cells, the first, the second, and the third word lines of each of the plurality of sets of word lines are applied with a word line forming voltage so turn on the first, the second and the third transistors, and the plurality of bit lines is applied with a bit line forming voltage.

5. The memory array according to claim 3, wherein when operating in the differential mode, when reading a selected memory cell among the plurality of memory cells, the second word line is applied a voltage to turn off the second transistor, the first and the third word lines are applied with a read voltage, the first conductive filament component of the selected memory cell generates a first reading current and the second conductive filament component generates a second reading current to respectively flow to the first and the second source lines of the corresponding set of source lines, and read the selected memory cell according to the first reading current and the second reading current.

6. The memory array according to claim 5, further comprising a sense amplifier having a first input end, a second input end and an output end, the first input end and the second input end of the sense amplifier are respectively coupled to the first and second source lines of the corresponding set of source lines to receive the first reading current and the second reading current, the output end outputs a reading result.

7. The memory array according to claim 3, wherein when operating in the single-ended mode, when reading a selected memory cell among the plurality of memory cells, the second word line is applied with a voltage to turn off the second transistor, one of the first and the third word lines is applied with a read voltage to make the first or the second conductive filament component of the selected memory cell generate a reading current to flow to the first or the second source line of the corresponding set of source lines, and read the selected memory cell according to the reading current and a reference current, one of the first and the third word line that is applied with the read voltage corresponds to the first conductive filament component or the second conductive filament component which forms the conductive filament.

8. The memory array according to claim 7, further comprising a sense amplifier having a first input end, a second input end and an output end, wherein one of the first input end and the second input end of the sense amplifier is coupled to the first or the second source line of the corresponding set of source lines, so as to receive a reading current of the first or the second conductive filament component which forms the conductive filament, the other one of the first input end and the second input end of the sense amplifier is coupled to a reference current, the output terminal outputs a reading result.

9. The memory array according to claim 1, wherein the plurality of memory cells is resistive memory cells, and the first and the second conductive filament components are made of transition metal oxide materials.

10. The memory array according to claim 1, wherein the memory array is used as a physical unclonable functions memory.

11. A method of operating a memory array, wherein the memory array comprises: a plurality of sets of word lines, wherein each set of the plurality of sets of word lines comprises a first word line, a second word line, and a third word line; a plurality of bit lines and a plurality of sets of source lines; and a plurality of memory cells, each of the plurality of memory cells is respectively arranged at an intersection of the plurality of sets of word lines and the plurality of bit lines, each memory cell comprises a first and a second conductive filament components and a switch circuit, and one ends of the first and the second conductive filament components are coupled to a corresponding bit in the plurality of bit lines, other ends of the first and the second conductive filament components are coupled to the switch circuit, and the operation method includes:

performing a filament forming on each of the plurality of memory cells, wherein one of the first and second conductive filament components is formed to create a conductive filament after the filament forming is finished, and the other one of the first and second conductive filament components is in a high resistance state; and operating the memory array in a differential mode or a single-ended mode to read each of the plurality of memory cells, wherein, when the memory array is operated in the differential mode, reading is performed according to a first reading current of the first conductive filament component and a second reading current of the second conductive filament component, when the memory array is operated in the single-ended mode, reading is performed according to a reading current of the first or the second conductive filament component which forms the conductive filament and a reference current.

12. The method of operating a memory array according to claim 11, further comprising:

after the filament forming is performed for each of the plurality of memory cells, the first reading current of the first conductive filament component and the second reading current of the second conductive filament component are read and latched;

comparing the first reading current with the second reading current;

determining which one of the first conductive and the second conductive filament components is successfully formed based on a comparison result of the first reading current and the second reading current; and performing a heavy forming to the first conductive or the second conductive filament component which is successfully formed.

13. The method of operating the memory array according to claim 11, wherein when performing the filament forming, the filament forming is performed to each of the plurality of memory cells together.

14. The method of operating the memory array according to claim 11, wherein the switch circuit comprises a first, a second and a third transistors that are connected in series, one end of the first conductive filament component is coupled to the corresponding bit line, and an other end of the first conductive filament component is coupled to a coupling point of the first and the second transistors, and one end of the second conductive filament component is coupled to the corresponding bit line, and an other end of the second conductive filament component is coupled to a coupling point of the second and the third transistors, each of the plurality of memory cells coupled to the same set of word lines among the plurality of sets of word lines, a gate of the first transistor is coupled to the first word line, a gate of the second transistor is coupled to the second word line, and a gate of the third transistor is coupled to the third word line, a first source/drain end of the first transistor is coupled to a first source line of a corresponding set of source lines in the plurality of sets of source lines, and a second source/drain end of the first transistor is coupled to a first source/drain end of the second transistor and the other end of the first conductive filament component, a second source/drain end of the second transistor is coupled to a first source/drain end of the third transistor and the other end of the second conductive filament component, and a second source/drain end of the third transistor is coupled to a second source line of the corresponding set of source lines in the plurality of sets of source lines.

15. The method of operating the memory array according to claim 14, further comprising:

when performing the filament forming to each of the plurality of memory cells, applying a word line forming voltage to the first, the second, and the third word lines of each of the plurality of sets of word lines to turn on the first, the second and the third transistors; and applying a bit line forming voltage to the plurality of bit lines.

16. The method of operating the memory array according to claim 14, wherein when operating in the differential mode, applying a voltage to the second word line to turn off the second transistor when reading a selected memory cell of the plurality of memory cells;

applying a read voltage to the first and the third word lines, so that the first conductive filament component of the selected memory cell generates a first reading current and the second conductive filament component generates a second reading current to respectively flow to the first and the second source lines of the corresponding set of source lines; and reading the selected memory cell according to the first reading current and the second reading current.

17. The method of operating the memory array according to claim 16, further comprising:

receiving the first reading current and the second reading current by a sense amplifier; and outputting a read result through an output end of the sense amplifier based on the first reading current and the second reading current, wherein the sense amplifier has a first input end and a second input end, the first input end and the second input end of the sense amplifier are respectively coupled to the first and the second source lines of the corresponding set of source lines to receive the first reading current and the second reading current.

18. The method of operating the memory array according to claim 14, wherein when operating in the single-ended mode, applying a voltage to the second word line to turn off the second transistor when reading the selected memory cell among the plurality of memory cells; and applying a read voltage to one of the first and the third word lines to make the first or the second conductive filament component of the selected memory cell generate a reading current to flow to the first or the second source line of the corresponding set of source lines; and reading the selected memory cell according to the reading current and a reference current, one of the first and the third word line that is applied with the read voltage corresponds to the first conductive filament component or the second conductive filament component which forms the conductive filament.

19. The method of operating the memory array according to claim 18, further comprising:

receiving the reading current of the first or the second conductive filament component which forms the conductive filament by a sense amplifier; and outputting a read result through an output end of the sense amplifier based on the reading current and the reference current, wherein the sense amplifier has a first input end and a second input end, one of the first input end and the second input end of the sense amplifier is coupled to the first or second source line of the corresponding set of source lines to receive the reading current of the first or the second conductive filament component, and the other one of the first input end and the second input end of the sense amplifier is coupled to the reference current.

* * * * *